United States Patent [19]

Chen

[11] Patent Number: 5,416,481
[45] Date of Patent: May 16, 1995

[54] ANALOG-TO-DIGITAL CONVERTER WITH MULTI-LEVEL DITHER CURRENT INPUT

[75] Inventor: Herbert M. K. Chen, Austin, Tex.

[73] Assignee: Advanced Micro Devices, Inc., Sunnyvale, Calif.

[21] Appl. No.: 126,545

[22] Filed: Sep. 24, 1993

[51] Int. Cl.[6] ............................................. H03M 1/20
[52] U.S. Cl. ..................................... 341/131; 341/143
[58] Field of Search ........................ 341/131, 143, 164

[56] References Cited

U.S. PATENT DOCUMENTS 4,354,176 10/1982 Aihara .
5,073,777 12/1991 Fukuhara et al. .................... 341/131
5,305,005 4/1994 Nakagawa et al. ................. 341/131

Primary Examiner—Marc S. Hoff
Attorney, Agent, or Firm—Foley & Lardner

[57] ABSTRACT

An improved sigma-delta analog-to-digital converter (ADC) is disclosed herein. The digital converter includes a dither circuit fabricated within the package of the ADC. The circuit is configured to apply a dither current to the analog input of the ADC. The frequency of the dither current is selected based upon the bandwidth of the analog signals for which the ADC is designed to sample and convert to digital signals. Application of the dither current to the input of the ADC reduces quantization noises produced as a result of certain ranges of DC offset voltages found within analog signals applied to the ADC.

22 Claims, 4 Drawing Sheets

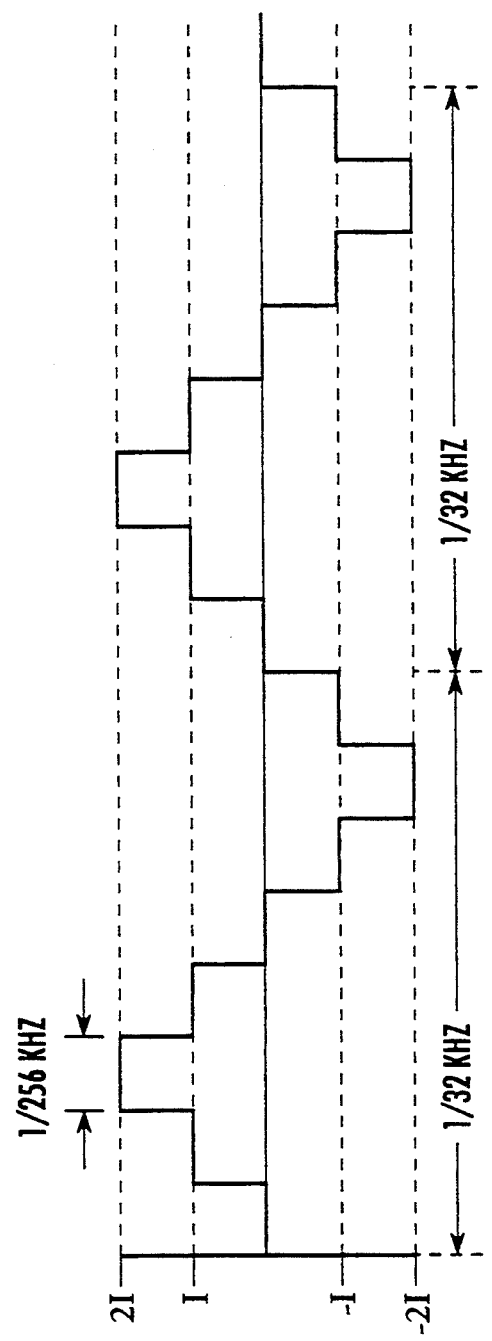

ANALOG-TO-DIGITAL CONVERTER WITH MULTI-LEVEL DITHER CURRENT INPUT

FIELD OF THE INVENTION

The present invention relates to an analog-to-digital converter (ADC). In particular, the present invention is related to the reduction of quantization noise in an ADC.

BACKGROUND OF THE INVENTION

One problem encountered in the design of first order sigma-delta ADCs is the presence of certain direct current (DC) offset voltages at the analog input of the ADC. Such DC offset voltages are typically generated by external circuitry or internal amplifiers. The DC offset voltages which are particularly problematic have amplitudes slightly offset from, but not equal to, voltages corresponding to multiples of one-half of the voltage represented by the least significant bit (LSB) of the ADC. When such DC offset voltages are present, the ADC will generate digital signals having recurrent patterns that approximate the value of the DC offset. Thus, the digital output of the ADC will be noisy when the repetition rate of the patterns is within the baseband of the ADC.

A similar noise problem occurs for certain alternating (AC) voltages when the sampling rate of the ADC is high compared to the baseband. In this situation, the low frequency of the AC signals, relative to the sampling rate, results in recurrent patterns in the digital output of the ADC which are similar to those produced by problematic DC offset voltages.

For many application, such as telecommunications, it is important to have low noise at steady state in the absence of an input signal, and a high signal-to-noise ratio when an input signal is present at the ADC. In both situations, it is important to eliminate or reduce the recurrent patterns in the digital output of the ADC. Accordingly, it would be useful to provide an improved ADC which reduces the recurrent patterns in the digital output of ADCs, such as sigma-delta ADCs, caused by certain level DC offsets and certain AC signals.

SUMMARY OF THE INVENTION

The present invention provides an analog-to-digital converter including an analog-to-digital conversion circuit and an alternating current source. The alternating current, which is supplemental to the signal which is being converted to a representative digital signal, is applied to the input of the analog-to-digital conversion circuit to reduce noise caused by quantization effects such as the DC offset or certain AC signals.

The present invention further provides an analog-to-digital converter including an integrator, a counter, a digital-to-analog converter (DAC), and an alternating current source. The integrator is coupled to the counter and applies a signal representative of the integral of an analog signal to the counter. The counter produces a digital signal representative of the integral. The counter is coupled to the digital-to-analog converter which converts the digital signal to an analog signal which is applied to the input of the integrator. The current source is also coupled to the input of the integrator, and applies an alternating current to the input which is subtracted from the analog signal applied to the analog-to-digital converter. The alternating current reduces the noise caused by quantization effects.

The present invention further provides an analog-to-digital converter including conversion means coupled to the current means. The conversion means produces a digital signal representative of an analog signal applied to the input of the converter, and the current means applies an alternating current to the analog input.

The present invention still further provides an analog-to-digital converter including integrator means, and counter means operatively coupled to form an analog-to-digital converter. The integrator means applies a signal representative of the integral of an analog signal to the counter means. The counter means produces a digital signal representative of the input signal applied to the integrator means. The counter means is coupled to the converter means which converts the digital signal to an analog signal which is applied to the input of the integrator means. The analog-to-digital converter also includes a current means which applies an alternating current to the input of the integrator means.

BRIEF DESCRIPTION OF THE DRAWINGS

FIG. 2 is a graphical representation of a waveform for a dither current applied to the input of the analog-to-digital converter illustrated in FIG. 1;

DETAILED DESCRIPTION OF THE PREFERRED EMBODIMENT

Figure 1:
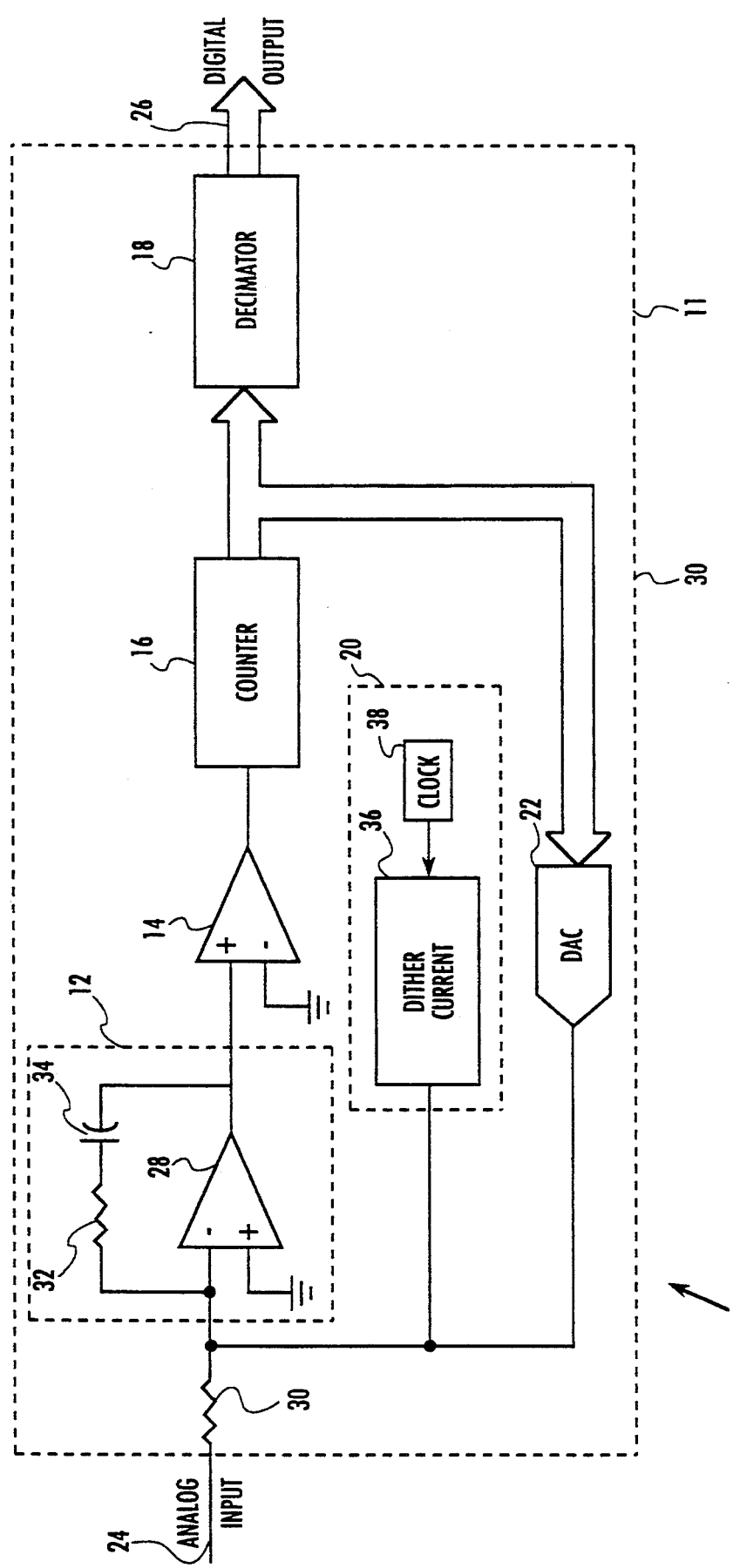
FIG. 1 is a schematic diagram of the preferred embodiment of an analog-to-digital converter according to the present invention.

Referring to FIG. 1, a sigma-delta analog-to-digital converter (ADC) 10 includes an integration circuit 12, a comparator circuit 14, a counter circuit 16, a decimator circuit 18, a dither current circuit 20, a digital-to-analog converter (DAC) 22, an analog input terminal 24, and a digital output 26. Circuits 12, 14, 16, 18, 20 and 22 are preferably fabricated from the same substrate, and disposed within a single integrated circuit package 11. In general, ADC 10 converts analog signals applied to input 24 into digital signals output at output 26. The preferred embodiment of ADC 10 illustrated in FIG. 1 is directed to the conversion of analog signals representative of audio signals having frequencies in the range of 20 Hz to 4 kHz. This type of ADC is typically used in telecommunications applications, where the baseband of 20 Hz to 4 kHz is satisfactory for converting analog signals representative of human voice to digital signals.

Integration circuit 12 includes an operational amplifier 28 having its inverting input coupled to analog input 24 by a resistor 30 and also coupled to the output by the series connection of a feedback resistor 32 and feedback capacitor 34. The non-inverting input of amplifier 28 is coupled to an appropriate reference voltage such as ground. The output of amplifier 28 is coupled to the non-inverting input of voltage comparator 14. The inverting input of comparator 14 is connected to an appropriate reference voltage such as ground. Comparator 14 is powered so that when the voltage at the non-inverting input is greater than the voltage at the inverting input, a high voltage (positive) is output at the output of comparator 14, and when the voltage at the non-inverting input is less than the voltage at the inverting input, the output of comparator 14 is negative (low). In general, the output of comparator 14 provides a digital signal to counter 16 which is either high, zero or low.

Although the number of bits produced at the output of counter 16 will vary depending on the application, the preferred embodiment provides for a 5 bit counter 16. The input of counter 16 is coupled to the output of comparator 14, and samples the output of comparator 14 at a rate in the range of 2-4 MHz, which results in an oversampling of the output of comparator 14. DAC 22 will have a resolution depending on counter 16 which has a resolution based upon the particular counter 16. In the preferred embodiment, DAC 22 has 5 bits of resolution. The digital input of DAC 22 is connected to the digital output of counter 16. The analog output of DAC 22 is connected to the inverting input of amplifier 28.

Dither current circuit 20 includes a multi-level dither current generator 36 and a clock 38. In the present embodiment, clock 38 has a frequency of 256 kHz. The output of circuit 20 is connected to the inverting input of amplifier 28 and applies a dither current to the inverting input of amplifier 28. Referring to FIG. 2, FIG. 2 illustrates the waveform for a 4-level dither current. This current has a fundamental frequency of 32 kHz based upon the 256 kHz clock rate and a step-shaped waveform substantially as shown in FIG. 2, wherein the current changes in steps of magnitude I. By way of modification, the waveform may be modified to have varying levels of dither. For example, the dither current could have a single level which results in an alternating square wave having a frequency of 32 kHz. In general, the dither current, whether 4-level, 2-level, or any other number of levels, is an alternating current which is supplemental to the current provided by the signal being monitored at analog input 24, and depending upon the application, may have varying waveforms. To avoid the introduction of substantial undesired noise, I is set at about 1/64 the value of the full scale current of DAC 22.

Decimator 18 is also coupled to the digital output of counter 16 and samples the digital output of counter 16 at a rate which is approximately twice that of the maximum frequency of the signal which is being monitored at analog input 24. To avoid undesired effects such as aliasing, decimator 18 includes two stages. The first stage is a digital low pass filter and the second stage is the circuitry which samples the output of the low pass filter. By way of example, if ADC 10 is designed to convert signals in the baseband of 20 Hz to 4 kHz, the sampling rate of the second stage of decimator 18 would be in the range of 8 kHz and the passband of the first stage would be 4 kHz (i.e., ½ the sampling frequency of the first stage). As a result, decimator 18 operates as a low pass filter to remove noise which is above the highest frequency of the signal desired to be sampled by ADC 10. For example, the fundamental frequency of the dither current is 32 kHz.

Referring now to the operation of ADC 10, ADC 10 may be used to operate on a continuous analog waveform applied to analog input 24 to produce a digital output comprising a sequence of binary numbers. Each of these numbers approximates a corresponding analog sample by a finite number of bits (e.g., 5 bits). Referring to the inverting input of amplifier 28, this input is basically a summing point at which an error signal is generated. The error signal is the difference between the analog signal applied to input 24, and the sum of the dither current produced by circuit 20 and the analog signal output by DAC 22. The error signal represents how closely the digital output of counter 16 approximates the analog signal at input 24. Integration circuit 12 integrates the error signal to filter out the high frequency components of the error signal and retain the portion of the error signal within the bandwidth of signals for which ADC 10 was designed to properly convert (baseband). For example, for audio telecommunications applications, it is desirable to calculate the values of feedback resistor 32 and feedback capacitor 34 so that components of the error signal above 4 kHz are filtered out and components of the signal below 4 kHz are substantially retained.

The output of integration circuit 12 is compared to a reference level (e.g., ground) by comparator 14. Counter 16 counts based upon the status of comparator 14, where counter 16 counts down if the output is low, counts up if the output of comparator 14 is high. DAC 22, as discussed above, converts the digital signals produced by counter 16 to an analog signal applied to the inverting input of amplifier 28.

As discussed above, the sampling rate of counter 16 is in the range of 2-4 MHz, which results in oversampling of input signals falling within the baseband of ADC 10 (20 Hz-4 kHz). In other words, the frequency of counter 16 is in the range of 100-200 times the maximum frequency of signals for which ADC 10 is designed to properly convert to digital signals. As a result of oversampling by counter 16, the quantization noise within the baseband of ADC 10 is reduced. However, the noise outside of the baseband of ADC 10 is increased due to the position of integration circuit 12 and the presence of the feedback loop including DAC 22. This outband noise is later removed by the low pass filter of decimator 18.

The effect of the dither current produced by dither current circuit 20 will now be discussed by way of example. Assuming that circuit 20 is idle, or nonexistent, and analog input 24 is at ground, the output of counter 16 will be a sequence of $+1, 0, -1, 0, +1, 0, -1, \ldots$ Decimation filter 18 operates to filter the output of counter 16 in this situation such that its digital output is a binary number representative of 0. Similarly, if the analog signal at input 24 is a DC signal and equals ½ of the voltage corresponding to the least significant bit, the counter output will be a sequence of $+1, 0, +1, 0 \ldots$ Decimation filter 18 filters this output from counter 16 and outputs a binary signal representative of 0.5. However, the situation will change where the DC offset is slightly higher than ½ of the corresponding voltage of the least significant bit by an amount $\Delta V$. In this situation, the counter output will generally remain in the $+1, 0, +1, 0$ sequence with the exception of occasional $+2$ output values (second least significant bit of the counter) to make up the $\Delta V$. The repetition rate of the $+2$ values produced at the second least significant bit of the counter depends upon the $\Delta V$, and the values of resistor 32 and capacitor 34, and the current output of DAC 22. Where the repetition rate of the change in state of the second least significant bit of counter 16 is within the bandwidth of decimator 18, the output of decimator 18 will be a digital signal representative of the signal at analog input 24 which is considered noisy. Thus, for an analog signal including a DC offset which is slightly higher than ½ of the corresponding voltage of the least significant bit, the signal-to-noise ratio for the signals is reduced due to the noise resulting at digital output 26, as discussed above.

In summary, the noise induced at digital output 26 varies widely, depending upon the DC offset level. The noise occurs in peaks and is most prominent when the DC component of a signal is around, but not exactly at, a multiple of ½ of the voltage corresponding to the least significant bit.

The dither current produced by dither current circuit 20 operates to disturb the DC offset level of a signal by adding or subtracting a current value of I or 2I at different times, where the value of I is set at about 1/64 the value of the full scale current of DAC 22. A dither current having a step-shaped waveform or other appropriately shaped waveform as shown in FIG. 2, when applied to the inverting input of amplifier 28, results in a disturbance of the DC offset since the current of the DC offset changes to values alternating by ±I for a 2-level dither and ±2I for a 4-level dither. The effect of the dither current is that DC offsets are disturbed so that the DC offset level is not sustained and the energy applied by a particular DC offset level to integrator 28 is reduced.

Figure 3A:
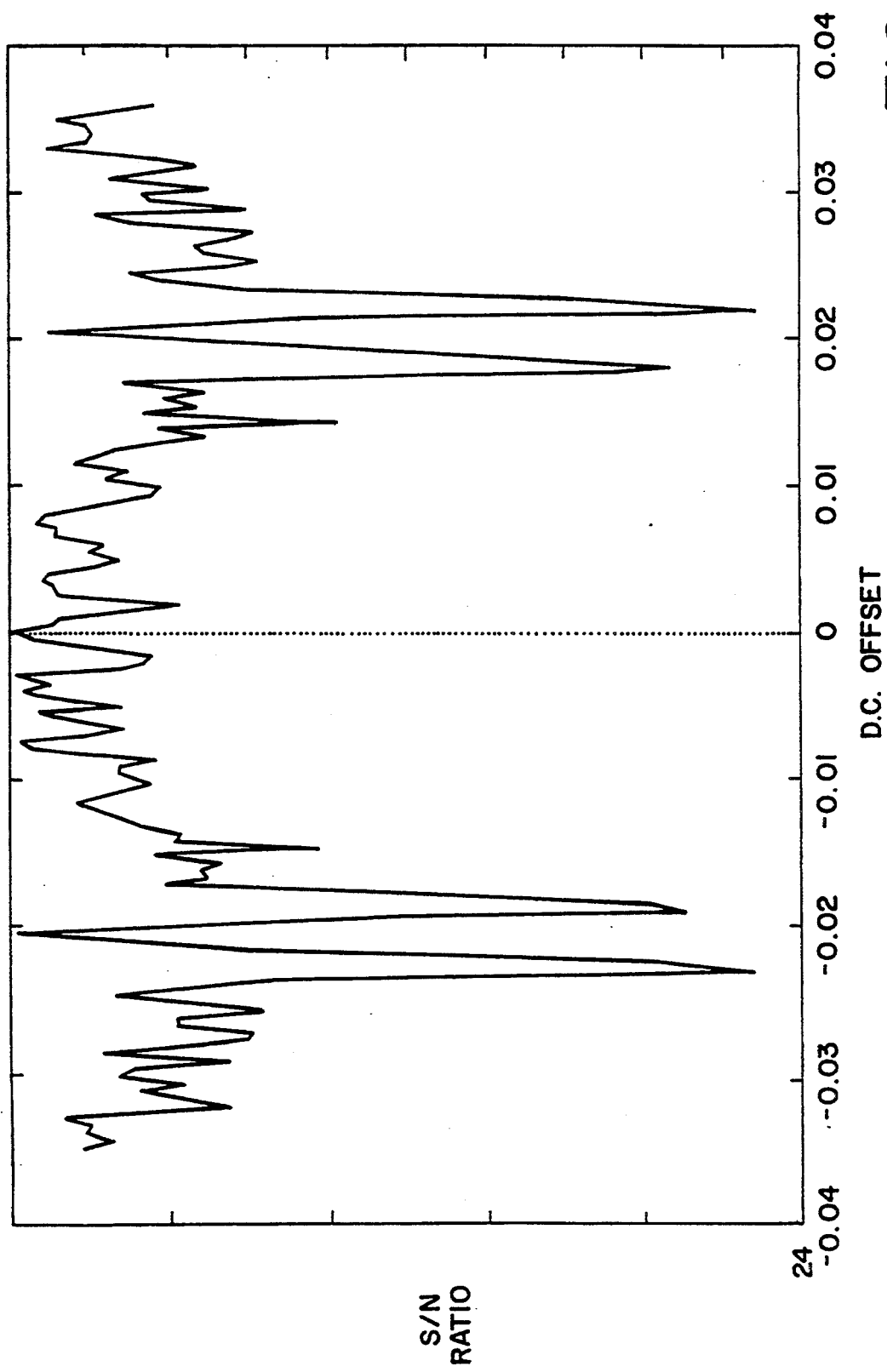
FIG. 3a is a graphical representation of signal-to-noise ratios vs. direct current offsets when a 2-level dither current is applied to the input of the analog-to-digital converter illustrated in FIG. 1.
Figure 3B:
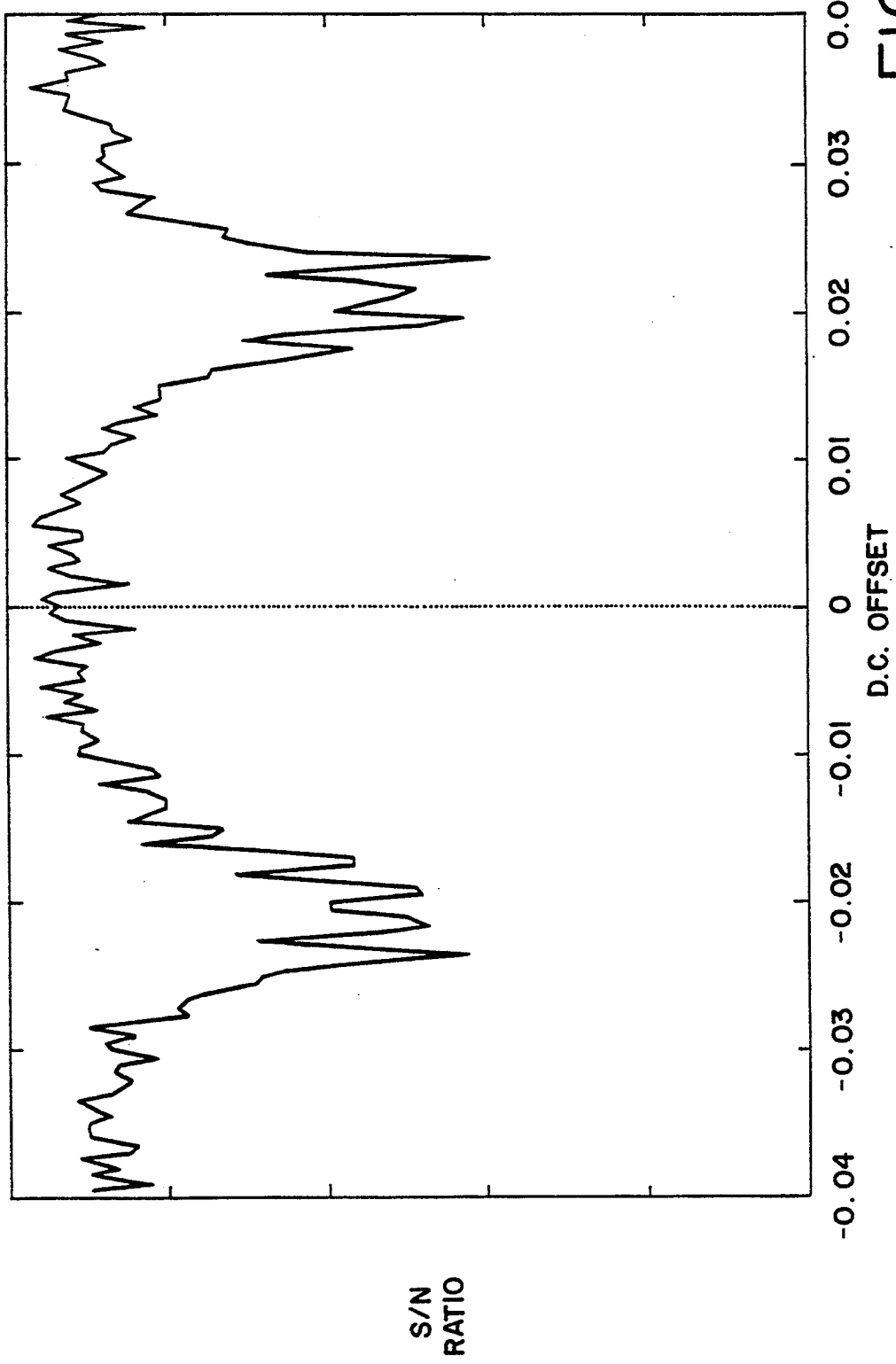
FIG. 3b is a graphical representation of signal-to-noise ratios vs. direct current offsets when a 4-level dither current is applied to the input of the analog-to-digital converter illustrated in FIG. 1.

Referring to FIGS. 3a and 3b, these figures are graphical representations of simulated signal-to-noise ratios (S/N) corresponding to a range of offset signals. Absolute scales on FIGS. 3a and 3b are not provided for the S/N axes since these figures are provided for relative comparison and the scales of FIGS. 3a and 3b are substantially the same. FIGS. 3a and 3b are exemplary only, and are directed to the situation where the voltage corresponding to the LSB is 0.05 volts. Thus, for this example, one-half of the voltage is 0.025 volts, and, as discussed above, a reduced S/N ratio around 0.025 volts and −0.025 volts would be expected. By way of further example, the vertical scales of FIGS. 3a and 3b may be 2 dB per division.

FIG. 3a illustrates the S/N ratio when a 2-level dither current is used. Without the dither current, the reduction in the S/N ratio would be even greater than that shown around 0.025 and −0.025 volts. FIG. 3b illustrates the S/N ratio when a 4-level dither current is used. In comparing FIGS. 3a and 3b, it can be seen that the 4-level dither current further reduces the drop in the S/N ratio around 0.025 and −0.025 volts. For a 4-level dither, the noise peaks may be reduced by up to ⅔, thus also reducing the repetitive noise energy by the same factor. By way of example, for ADC 10, operative for a baseband of 20 Hz to 4 kHz, the frequency of the dither current is set at approximately 32 kHz which is approximately 4 times the sampling frequency of the first stage of decimator 18 and 8 times the sampling frequency of the second stage of decimator 18. This allows decimator 18 to filter out the high frequency harmonics of the dither current.

It will be understood that the above description is of the preferred exemplary embodiment of the invention, and that the invention is not limited to the specific forms shown. For example, decimator 18 may consist of several decimation filters to permit proper tailoring of the decimation filter to the types and bandwidths of the signals for which ADC 10 is configured to sample. Various other substitutions, modifications, changes and omissions may be made in the design and arrangement of the elements of the preferred embodiment without departing from the spirit of the invention as expressed in the appended claims.

What is claimed is:

1. An analog-to-digital converter comprising:
   a package;
   an analog-to-digital conversion circuit located within the package and including an analog input and a digital output, the conversion circuit being configured to produce a digital signal at the digital output representative of an analog signal applied to the analog input; and
   an alternating current source located within the package, including a current output coupled to the analog input, and configured to apply an alternating current to the analog input;
   said alternating current being a multi-level dither current; said analog-to-digital conversion circuit being configured to produce digital signals representative of analog signals having frequencies below a predetermined limit, the alternating current having a frequency greater than the predetermined limit.

2. An analog-to-digital converter as recited in claim 1, further comprising a decimator coupled to the digital output.

3. An analog-to-digital converter as recited in claim 2, wherein the decimator is configured to sample the digital signal at a frequency which is greater than the predetermined limit.

4. An analog-to-digital converter as recited in claim 1, wherein the alternating current is a multi-level dither current.

5. An analog-to-digital converter as recited in claim 1, wherein the conversion circuit comprises:
   an integrator coupled to the analog input and including a first output, the integrator being configured to produce an output signal at the first output representative of the integral of an analog signal applied to the analog input;
   a counter including a digital counter output and a counter input coupled to the first output, the counter being configured to output a digital signal at the digital counter output dependent upon a signal applied to the counter input and representative of the analog signal; and
   a digital-to-analog converter including a first digital input coupled to the digital counter output, and a second output coupled to the analog input.

6. An analog-to-digital converter as recited in claim 5, wherein the frequency of the counter is at least one-hundred times the predetermined limit.

7. An analog-to-digital converter as recited in claim 5, further comprising a comparator disposed to couple the integrator to the counter.

8. An analog-to-digital converter comprising:
   an integrator including a first analog input and a first output, the integrator being configured to produce an output signal at the first output representative of the integral of an analog signal applied to the first analog input;
   a counter including a first digital output and a counter input coupled to the first output, the counter being configured to output a digital signal at the first digital output representative of the analog signal;
   a digital-to-analog converter including a first digital input coupled to the first digital output, and a second output coupled to the first analog input;

an alternating current source including a current output coupled to the first analog input, the alternating current source being configured to apply an alternating current to the first analog input; and a comparator disposed to couple the integrator to the counter, the comparator being configured to output a comparison signal representative of the integral of the analog signal;

said alternating current being a multi-level dither current; said analog-to-digital converter being configured to produce digital signals representative of analog signals having frequencies below a predetermined limit, the alternating current having a frequency greater than the predetermined limit.

9. An analog-to-digital converter as recited in claim 8, further comprising a decimator coupled to the digital output and configured to sample the digital signal at a frequency which is greater than the predetermined limit.

10. An analog-to-digital converter comprising:

conversion means, including an analog input and a digital output, for producing a digital signal at the digital output representative of an analog signal applied to the analog input; and current means, including a current output coupled to the analog input, for applying a supplemental alternating current to the analog input;

said alternating current being a multi-level dither current; said conversion means producing digital signals representative of analog signals having frequencies below a predetermined limit, the dither current having a frequency greater than the predetermined limit.

11. An analog-to-digital converter as recited in claim 10, further comprising decimator means for sampling the digital signal at a frequency which is greater than the predetermined limit.

12. An analog-to-digital converter as recited in claim 10, wherein the conversion means comprises:

integrator means, coupled to the analog input and including a first output, for generating an output signal at the first output representative of the integral of an analog signal applied to the analog input;

counter means, including a counter input coupled to the first output and a digital counter output, for generating a digital signal at the digital counter output dependent upon a signal applied to the counter input and representative of the analog signal; and converter means, including a first digital input coupled to the digital counter output and a second output coupled to the analog input, for converting digital signals at the first digital input to analog signals applied to the second output;

said frequency of the counter means being at least one-hundred times the predetermined limit.

13. An analog-to-digital converter as recited in claim 12, further comprising a comparator means for coupling the integrator means to the counter means.

14. An analog-to-digital converter comprising:

integrator means, including a first analog input and a first output, for generating an output signal at the first output representative of the integral of an analog signal applied to the first analog input;

counter means, including a first digital output and a counter input coupled to the first output, for generating a digital signal at the first digital output representative of the analog signal;

converter means, including a first digital input coupled to the first digital output and a second output coupled to the first analog input, for generating an analog signal at the second output representative of digital signals at the first digital input;

current means, including a current output coupled to the first analog input, for applying a supplemental alternating current to the first analog input; and comparator means for coupling the integrator means to the counter means and generating a comparison signal representative of the integral of the analog signal;

said alternating current being a multi-level dither current; said analog-to-digital converter being configured to produce digital signals representative of analog signals having frequencies below a predetermined limit, where the alternating current has a frequency greater than the predetermined limit.

15. An analog-to-digital converter as recited in claim 14, further comprising decimator means coupled to the digital output for sampling the digital signal at a frequency which is greater than the predetermined limit.

16. A converter for converting an analog signal to a digital signal representative of the analog signal comprising:

an analog-to-digital conversion circuit including an analog input and a digital output, the conversion circuit being configured to produce a digital signal at the digital output representative of an analog signal applied to the analog input; and an alternating current source including a current output coupled to the analog input, and configured to apply an alternating current, supplemental to the analog signal, to the analog input;

said alternating current being a multi-level dither current; said analog-to-digital conversion circuit being configured to produce digital signals representative of analog signals having frequencies below a predetermined limit, the alternating current having a frequency greater than the predetermined limit.

17. A converter as recited in claim 16, further comprising a decimator coupled to the digital output.

18. A converter as recited in claim 17, wherein the decimator is configured to sample the digital signal at a frequency which is greater than the predetermined limit.

19. A converter as recited in claim 16, wherein the alternating current is a multi-level dither current.

20. A converter as recited in claim 16, wherein the conversion circuit comprises:

an integrator coupled to the analog input and including a first output, the integrator being configured to produce an output signal at the first output representative of the integral of an analog signal applied to the analog input;

a counter including a digital counter output and a counter input coupled to the first output, the counter being configured to output a digital signal at the digital counter output dependent upon a signal applied to the counter input and representative of the analog signal; and a digital-to-analog converter including a first digital input coupled to the digital counter output, and a second output coupled to the analog input.

21. A converter as recited in claim 20, further comprising a comparator disposed to couple the integrator to the counter.

22. A converter as recited in claim 16, wherein the frequency of the counter is at least one-hundred times the predetermined limit.

* * * * *